United States Patent
Jacobs et al.

(10) Patent No.: US 8,846,430 B1
(45) Date of Patent: Sep. 30, 2014

(54) METHOD OF MAKING A RESERVOIR FOR MICROMECHANICAL DEVICE LUBRICATION

(71) Applicant: Texas Instruments Incorporated, Dallas, TX (US)

(72) Inventors: Simon J. Jacobs, Lucas, TX (US); Seth Miller, Englewood, CO (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/888,758

(22) Filed: May 7, 2013

Related U.S. Application Data

(62) Division of application No. 11/617,459, filed on Dec. 28, 2006, now Pat. No. 8,436,453.

(51) Int. Cl.
*H01L 21/00* (2006.01)

(52) U.S. Cl.
USPC .................................. 438/50; 257/E23.137

(58) Field of Classification Search
CPC .. H01L 2924/00; H01L 23/26; H01L 51/5237
USPC ...................... 438/50; 257/E23.137; 428/212; 427/372.2
See application file for complete search history.

(56) References Cited

U.S. PATENT DOCUMENTS

| | | |
|---|---|---|
| 5,070,197 A | 12/1991 | Chin et al. |
| 5,331,454 A | 7/1994 | Hornbeck |
| 5,359,204 A | 10/1994 | Eguchi et al. |
| 5,610,438 A | 3/1997 | Wallace et al. |
| 5,648,107 A * | 7/1997 | Kagawa et al. ............... 425/363 |
| 5,694,740 A | 12/1997 | Martin et al. |
| 5,792,717 A | 8/1998 | Takayama |
| 5,939,785 A | 8/1999 | Klonis et al. |
| 6,204,085 B1 | 3/2001 | Strumpell et al. |
| 6,251,842 B1 * | 6/2001 | Gudeman ..................... 508/577 |
| 6,259,551 B1 | 7/2001 | Jacobs |
| 6,300,294 B1 | 10/2001 | Robbins et al. |
| 6,716,642 B1 | 4/2004 | Wu et al. |
| 6,746,886 B2 | 6/2004 | Duncan et al. |
| 6,787,187 B2 | 9/2004 | Jacobs |
| 6,806,993 B1 | 10/2004 | Adams et al. |
| 6,843,936 B1 | 1/2005 | Jacobs |
| 6,951,769 B2 | 10/2005 | Malone |
| 7,435,704 B2 | 10/2008 | Hekal |

(Continued)

FOREIGN PATENT DOCUMENTS

WO     WO 0157920     8/2001

OTHER PUBLICATIONS

Santos et al., "Standard Transition Aluminas Electron Microscopy Studies", Materials Research vol. 3 No. 4, 104-114, São Carlos, Nov. 17, 2000.

*Primary Examiner* — Duy T Nguyen
(74) *Attorney, Agent, or Firm* — Warren L. Franz; Wade J. Brady, III; Frederick J. Telecky, Jr.

(57) ABSTRACT

The present application is directed to a reservoir for use with a micro-electromechanical device having a first surface area to be lubricated. The reservoir comprises a solid component with a porous structure having a second surface area. The second surface area is greater than the first surface area. The reservoir also comprises a lubricant capable of reversibly reacting with either the solid component or the first surface area of the microelectromechanical device.

15 Claims, 1 Drawing Sheet

(56) References Cited

U.S. PATENT DOCUMENTS

| | | |
|---|---|---|
| 2001/0023938 A1 | 9/2001 | Allen et al. |
| 2002/0063322 A1 | 5/2002 | Robbins et al. |
| 2003/0002019 A1 | 1/2003 | Miller |
| 2003/0064149 A1 | 4/2003 | Miller |
| 2003/0211650 A1 | 11/2003 | Martin |
| 2004/0224095 A1 | 11/2004 | Miller |
| 2005/0178848 A1* | 8/2005 | Robbins .................. 239/10 |
| 2006/0022158 A1 | 2/2006 | Feinberg et al. |
| 2006/0252889 A1* | 11/2006 | Natarajan et al. ............ 525/449 |
| 2007/0231541 A1 | 10/2007 | Humpal et al. |
| 2007/0271808 A9 | 11/2007 | Wang et al. |
| 2008/0272446 A1 | 11/2008 | Haluzak et al. |

\* cited by examiner

METHOD OF MAKING A RESERVOIR FOR MICROMECHANICAL DEVICE LUBRICATION

This application is a division of application Ser. No. 11/617,459, filed Dec. 28, 2006 (now U.S. Pat. No. 8,436,453), the entirety of which is incorporated herein by reference.

BACKGROUND

The present application is directed to device package and method of making a device package, and more particularly to a microelectromechanical systems (MEMS) device package having a reservoir containing lubricant compounds for forming passivation layers on a MEMS device.

Many microelectromechanical systems (MEMS) include moving components that place unique demands on surface lubrication and passivation systems. For example, metal, oxidized metal or semi-metal surfaces can make repeated contact during operation of MEMS devices. This repeated contact can result in undesirable sticking and friction, known as stiction, between the contacting surfaces. Stiction may be caused by, for example, the capillary action of water vapor present on the contacting surfaces, van der Waals attraction, and intermetallic bonding of metals.

One known approach for addressing the stiction problem is the application of passivation coatings, which can reduce stiction and wear between the contacting surfaces. Known passivation coatings include monolayers of long-chain aliphatic halogenated polar compounds, such as perfluorodecanoic acid (PFDA). This acid is characterized by a chain having an $-CF_3$ group at a first end, a $-COOH$ group at the second end, and intermediate $-CF_2$ groups. The $-COOH$ group allows the PFDA molecule to attach to desired surfaces of the MEMS, while the low surface energy $-CF_3$ and $-CF_2$ groups effectively lower the surface energy of the contacting surfaces of the MEMS, thereby reducing the stiction problem.

However, over time in a MEMS device, the repeated contact of moving surfaces may wear away the passivation coatings and increase the tendency for the moving surfaces to stick, adhere, or otherwise resist separation. This lack of stability of the surface coatings formed from PFDA and other perfluorinated carboxylic acids add to the costs of manufacturing of the MEMS devices. In addition, while halogenated polar compounds, such as PFDA, provide low-energy surface coating and result in satisfactory device performance, there are materials compatibility and handling issues associated with these compounds. Accordingly, there is a need for improved passivation compounds and systems for overcoming the above described problems.

SUMMARY OF THE DISCLOSURE

In accordance with the disclosure, an embodiment of the present application is directed to a reservoir for use with a micro-electromechanical device having a first surface area to be lubricated. The reservoir comprises a solid component with a porous structure having a second surface area. The second surface area is greater than the first surface area. The reservoir also comprises a lubricant capable of reversibly reacting with either the solid component or the first surface area of the micro-electromechanical device.

Another embodiment of the present application is directed to a method of making a reservoir for use with a micro-electromechanical device having a first surface area to be lubricated. The method comprises combining a solid component forming material and at least one ingredient chosen from a lubricant, a binder forming material, a desiccant and a solvent to form a mixture. The mixture is applied to a substrate surface and cured to form a solid component with a porous structure having a second surface area, wherein the second surface area is greater than the first surface area.

Another embodiment of the present application is directed to a method of maintaining a passivation layer on a micro-electromechanical device having a first surface for lubrication. The micro-electromechanical device has a cavity package with at least one lubricant-containing reservoir. The method comprises sealing the package to substantially limit ingress or egress of the lubricant outside of the package; and causing lubricant in the reservoir, on a surface of the device, and lubricant in a vapor phase to reach a chemical equilibrium, so that lubricant displaced from the first surface is replenished and the passivation layer is maintained.

Another embodiment of the present application is directed to a micro-electromechanical device package. The package comprises a substrate and a cover positioned in proximity to the substrate so as to form a sealed cavity between the substrate and the cover. A micro-electromechanical device and a reservoir are positioned in the cavity. The micro-electromechanical device has a first surface passivated with a lubricant. The reservoir comprises a solid component with a porous structure having a second surface area, wherein the surface area of the solid surface is greater than the surface area of the first surface. The reservoir also comprises a lubricant capable of reversibly reacting with either the solid component or the first surface.

Additional objects and advantages of the disclosure will be set forth in part in the description which follows, and can be learned by practice of the disclosure. The objects and advantages of the disclosure will be realized and attained by means of the elements and combinations particularly pointed out in the appended claims.

It is to be understood that both the foregoing general description and the following detailed description are exemplary and explanatory only and are not restrictive of the disclosure, as claimed.

The accompanying drawings, which are incorporated in and constitute a part of this specification, illustrate several embodiments of the disclosure and, together with the description, serve to explain the principles of the disclosure.

DESCRIPTION OF EXAMPLE EMBODIMENTS

Reference will now be made in detail to various exemplary embodiments of the present application, examples of which are illustrated in the accompanying drawings. Wherever possible, the same reference numbers will be used throughout the drawings to refer to the same or like parts.

In one embodiment, the present application is directed to a system of continuous passivation for micro-electromechanical devices. The system comprises a reservoir with a relatively high surface area compared to the surface area of the micro-electromechanical device to be passivated. The reservoir can be impregnated with the lubricant, and positioned within an enclosure, or cavity, of the device package. In an embodiment, the enclosure can be hermetically sealed to reduce the tendency for moisture to enter the enclosure. Over time, the reservoir can release the lubricant to continuously coat the surfaces of engaging elements.

The relatively high surface area of the reservoir provides for a sufficient supply of the lubricant to achieve a desired equilibrium vapor pressure of the lubricant in the enclosure surrounding the device, thereby providing an improved ability to maintain the passivation layer on the micro-electromechanical device for any given lubricant compound. By continuously supplying the micro-electromechanical surfaces with the lubricant during operation of the micro-electromechanical device, the tendency for contacting elements to stick, adhere or otherwise resist separation can be ameliorated or eliminated.

Figure 1:
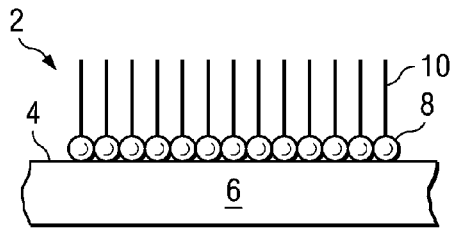
FIG. 1 illustrates a passivation layer for use in MEMS devices, according to one embodiment of the present application.

FIG. 1 illustrates a passivated MEMS devices, according to one embodiment of the present application. As illustrated in the embodiment of FIG. 1, passivation layer 2 is formed on a surface 4 of a MEMS device 6. MEMS device 6 may be any micromechanical device which may benefit from lubrication and/or passivation. Exemplary MEMS devices include micro-motors, micro-gears, and micromechanical deformable mirror devices (DMDs).

Surface 4 may be any surface of the MEMS device which comprises a material on which passivation layer 2 is capable of forming. In one embodiment, surface 4 comprises a surface of a landing electrode of a DMD. Surface 4 may comprise metals, metal alloys, metal oxides, semiconductors, oxides of semiconductors, and compounds including both metals and semiconductors. Examples of suitable metals include aluminum, titanium, tungsten, indium, chromium, hafnium, and copper. Examples of alloys include two or more of the above listed metals, such as binary alloys of titanium and aluminum or titanium and tungsten. Examples of semiconductors include silicon, germanium, and compound semiconductors such as gallium arsenide. Compounds including both metals and semiconductors can include any combination of one or more of the above listed metals and one or more of the above listed semiconductors. Specific examples of such metal/semiconductor compounds include metal silicides, such as aluminum silicide, tungsten silicide and chromium silicide, or ternary or higher silicide compounds, such as aluminum, titanium, and silicon. Surface 4 may also comprise oxides or nitrides of metals or semiconductors, such as aluminum oxide, an oxide of an aluminum alloy, silicon oxide, titanium nitride, silicon nitride, or oxynitrides, such as, silicon oxynitride.

Passivation layer 2 may be in the form of a self-assembled monolayer which acts to passivate and/or lubricate surface 4. Passivation layer 2 may comprise one or more lubricants that are capable of binding to surface 4 and which can provide the desired passivation and/or lubrication. In one embodiment, passivation layer 2 provides the desired passivation and/or lubrication by reducing the surface energy of surface 4 of the MEMS device 6 compared to the surface energy prior to formation of passivation layer 2.

In an embodiment of the present application, passivation layer 2 comprises one or more amphiphilic organic compounds. The amphiphilic organic compounds of passivation layer 2 can comprise a polar functional group 8 that is capable of binding to surface 4, and a substantially nonpolar tail 10. For example, the lubricant can comprise a linear, branched or cyclic, aliphatic or aromatic organic compound having a proton acidic functional group with an acid dissociation constant of no more than approximately seven. In some embodiments, the proton acidic functional group can comprise oxygen atoms bound to main group atoms, and at least one oxygen atom bound to a hydrogen atom. However, other proton acidic functional groups can also be employed, as will be discussed below. In yet other embodiments, the lubricant can comprise a linear, branched or cyclic, aliphatic or aromatic organic compound having a Bronsted base functional group with an acid dissociation constant of greater than approximately seven.

In one embodiment, the amphiphilic lubricant compounds used to form passivation layer 2 can have the general formula:

$$X\text{—}R \quad (I)$$

where X is a polar functional group and R is a substantially nonpolar group. In other embodiments, compounds having multiple polar functional groups and/or multiple nonpolar groups can be employed.

X can be any polar functional group capable of association or binding with the target surfaces. In some embodiments, X can comprise one or more elements from the commonly denoted "main group" elements in columns 13, 14, 15, and 16 of the periodic table, bound to one or more dissimilar elements such that a substantial permanent molecular dipole moment results.

For example, X can be a proton acidic functional group formed by a main group element from columns 13, 14, 15, and 16 of the periodic table (such as boron, carbon, phosphorus, and sulfur). As described above, the main group element can be bound to one or more oxygen atoms where at least one of the oxygen atoms is bound to a hydrogen atom.

Common examples of such acidic functional groups include carboxyl groups (—COOH), boronic acid groups (—B(OH)$_2$), phosphinic acid groups (—PO(OH)H), phosphonic acid groups (—PO(OH)$_2$), phosphoric acid groups (—OPO(OH)$_2$), sulfinic acid groups (—SO(OH)), sulfonic acid groups (—SO$_2$OH), and sulfuric acid groups (—OSO$_2$OH). Further examples of polar groups include derivatives of these acid functional groups, including esters, such as phosphoric acid esters and sulfuric acid esters, as well as other derivatives, such as acid halides, and acid anhydrides.

In some embodiments, X can include at least one nitrogen atom, such as primary or secondary amino groups (—NH$_2$ or —NH), carboxamido, and nitro groups. In embodiments where X is an amino group, such as in the case of aliphatic amines, the compound will generally be a Bronstead base with an acid dissociation constant of greater than approximately seven. In other embodiments, polar group compounds can include an atom of a group 16 element bound to hydrogen, such as hydroxyl and thiol groups.

The nonpolar group, R, of formula I, can comprise a hydrocarbon containing from about 2 to about 30 carbon atoms, such as from about 6 to about 18 carbon atoms, and as a further example, from about 8 to about 14 carbon atoms. The hydrocarbon portion, R, of the passivating compound can be linear, branched, or cyclic; saturated, unsaturated or polyunsaturated; aliphatic or aromatic; and substituted or unsubstituted.

In an embodiment, the hydrocarbon portion, R, of the passivating compound can be substituted with any substituent group that does not substantially interfere with the polar group's reactivity with either the surface 4 of the device to be passivated or a solid complexing agent component, described in greater detail below. Non-limiting examples of suitable substituents include electronegative functional groups, including halogens, such as fluorine, bromine, iodine, and chlorine; $C_1$-$C_8$ alkyl groups, such as methyl, ethyl, and propyl groups; $C_1$-$C_8$ alkenyl groups, such as vinyl and allyl groups; $C_4$-$C_8$ aryl groups, such as phenyl and benzyl groups; and any groups that contain an oxygen, including alkoxy groups such as methoxy and ethoxy, aryloxy groups such as phenoxy and 2-methylphenoxy, and hydroxyl groups.

Examples of branched or substituted carboxylic acids which may be suitable for use per the present invention include 9-methyldecanoic acid, 3-phenylpropanoic acid, 8-methoxyoctanoic acid, 2-chlorodecanoic acid, 3-fluorodecanoic acid, furan-2-carboxylic acid, 4-hydroxydecanoic acid, and 5-oxohexanoic acid. Examples of linear carboxylic acids that may be suitable as passivating compounds include saturated carboxylic acids with the general formula $C_nH_{2n+1}COOH$, where $1<=n<=30$.

In some embodiments, the hydrocarbon compounds can be perfluorinated carboxylic acids, such as perfluorodecanoic acid. However, as described above, these compounds can have disadvantages. If it is desired to avoid these disadvantages, hydrocarbon compounds that are not perfluorinated can be employed.

In some embodiments, the lubricant may comprise a plurality of different compounds. In one embodiment, the lubricant can comprise two or more different linear, branched or cyclic, aliphatic or aromatic organic compounds, wherein each organic compound has a proton acidic functional group with an acid dissociation constant of no more than approximately seven. For example, the lubricant may comprise two, three, or more of the carboxylic acids described above.

The lubricant can have any $pK_a$ value so long as the lubricant can form a passivation layer on a substrate that is suitable for providing the desired lubrication. In the case of an acidic polar group, the lubricant has a $pK_a$ of less than 7, for example, less than or equal to about 6, and as a further example less than or equal to about 5.

Passivation layer 2 may be formed by any suitable method. One suitable method for forming passivation layer 2 layer will now be discussed with respect to the flow chart illustrated in FIG. 2.

Figure 2:
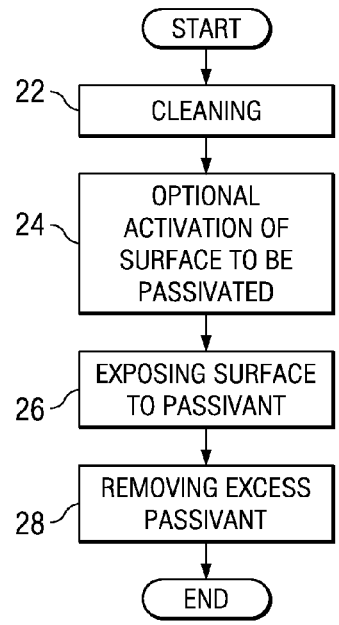
FIG. 2 is flow diagram of a process for forming a passivation layer, according to one embodiment of the present application.

Prior to carrying out the process of the embodiment of FIG. 2, various coating and etching processes may be carried out to form the MEMS devices. In certain embodiments, where the MEMS devices are formed on a wafer, the wafer may be diced into individual chips before forming passivation layer 2. In other embodiments, passivation layer 2 may be formed prior to dicing.

As illustrated in block 22 of the flow diagram of the FIG. 2 embodiment, one or more cleaning processes may be carried out to remove organic and inorganic contaminants, such as debris from dicing, residual photoresist, native oxides, and water from the surface of the devices. Any suitable cleaning processes may be employed, including both dry and wet cleaning processes. Suitable cleaning processes for removing such contaminants are well known in the art. In one embodiment, the cleaning process may comprise exposing the surface of the MEMS device to an oxygen plasma at, for example, room temperature.

After cleaning, the device surfaces may optionally be activated, as shown in block 24, to provide a high energy surface which allows the lubricant to form the desired passivation layer 2. Any suitable method for activating the surface may be employed. In one embodiment, surface activation may be accomplished by placing the MEMS device into an oxygen/fluorine plasma. The plasma may be formed using source gases comprising oxygen and fluorine, such as $O_2$ and $NF_3$, at appropriate power, pressure, temperature and flow rates for adequate time to achieve the desired surface activation. In one exemplary embodiment, the plasma may be formed using the following process parameters: Power—about 100 W; Pressure—about 2 torr; Flow rates ($NF_3$—about 2 SCCM, $O_2$—about 180 SCCM, He—about 50 SCCM); Temp—about Room temperature; and Time—about 20 sec. The activation step according to this embodiment increases the surface energy by introduction of oxygen and fluorine atoms to the surface layer.

As illustrated in block 26 of the embodiment of FIG. 2, the MEMS device surfaces are then exposed to the lubricant in the form of a gas to form passivation layer 2. This may be accomplished by any suitable process. In one embodiment, the MEMS device may be placed in a deposition chamber along with the above-described lubricant in liquid or solid form under conditions, such as reduced pressures and/or elevated temperatures, which cause the lubricant to evaporate. In another embodiment, the lubricant may be introduced into the chamber in a gaseous form. In either embodiment, the lubricant in a gaseous form contacts the MEMS surface to form passivation layer 2, as described above with respect to FIG. 1. In certain embodiments, the MEMS device may be heated to achieve the formation of passivation layer 2.

In some embodiments, as illustrated in block 28 of the embodiment of FIG. 2, it may be desirable to remove excess lubricant from the MEMS device after passivation layer 2 is formed. One suitable method for removing excess source material is to evacuate the deposition chamber after the deposition is finished.

Figure 3:
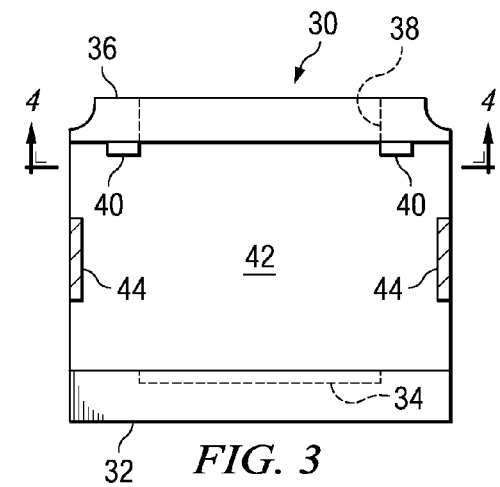
FIG. 3 is an exploded side view of a package for a MEMS device of the digital micromirror device (DMD) type, comprising a reservoir for holding a lubricant, according to an embodiment of the present application.

FIG. 3 illustrates an embodiment of a device package 30 for a MEMS device, according to the present application. By way of example and for purposes of illustration, device package 30 is a package for a digital micromirror device (DMD). As discussed above, while the present application discusses a DMD as one illustrative embodiment, limitation to such uses is not to be inferred. For instance, the present disclosure is well suited for use with other MEMS devices which can benefit from lubrication and/or reduced stiction, such as micro-motors, micro-gears, etc.

Still referring to the embodiment of FIG. 3, device package 30 is shown to have a substrate 32, which may comprise any suitable material, such as ceramic, with a DMD die 34 attached thereto. As is well known in the art, a DMD is an integrated circuit comprising an array of tiny micromirrors suspended over an array of address electrodes (not shown). Each of these mirrors is capable of rotating on either side of a torsion axis to modulate incident light directed thereupon when implemented in a display device, such as a projector or T.V., or in a hard copy printer. The mirrors repeatedly land upon landing electrodes, and may experience stiction problems.

In the illustrated embodiment, DMD die 34 can be enclosed in package 30 comprising a cover 36 having a window 38. Cover 36 may comprise any suitable material, such as ceramic. Although shown in exploded form in FIG. 3, cover 36 can be hermetically sealed upon substrate 32 in a manner that creates a sealed cavity 42 between the DMD die 34 and cover 36. For example, in one embodiment, one or more spacers 44 may be positioned between cover 36 and substrate 32 to provide the desired cavity 42, as is well known in the art. Package 30 substantially limits ingress or egress of the lubricant from the package.

In the illustrated embodiment, reservoirs 40 are affixed along a pair of opposing edges of window 38. Reservoirs 40 comprise a solid component, also referred to herein as a solid complexing agent component, which has a surface area that is greater than the surface area of the device to be passivated. The solid component is capable of reversibly reacting with the lubricant used to passivate the device. The reaction can occur through any suitable reversible surface chemical reaction mechanism and can include reversibly complexing, reversibly binding, absorption, and adsorption.

The solid component can comprise inorganic complexing materials, organic complexing materials and mixtures of inorganic and organic complexing materials. In some embodiments, the solid component can react with water through either absorption or adsorption. For example, the solid component can comprise a water absorption or adsorption material described in more detail below.

The solid component is capable of providing a high surface area compared to the surface area of the MEMS device to be passivated, such as DMD die 34 in the illustrated embodiment. In embodiments of the present application, the surface area of the solid component included in the reservoir can be at least ten times the surface area of the MEMS device to be passivated. In some embodiments, the surface area of the solid component can be two, three, or more orders of magnitude higher than the surface area of the MEMS device to be passivated. For example, in one embodiment, the surface area of reservoir 40 for adsorbing/desorbing lubricant may be a thousand times greater than the surface area of the MEMS device to be passivated.

Thus, in one specific example, if the surface area of the MEMS device is on the order of 10 cm$^2$, then the desired surface area of the solid component can range from about 100 cm$^2$ to about 5 m$^2$. While the current invention does not contemplate an upper limit on the size of the reservoir, practical considerations will dictate a reasonable size for the reservoir.

Materials which provide a relatively high surface for a given mass can be employed. For example, the solid component of reservoir 40 may be capable of providing a passivated surface area of about 5 square meters per gram of the solid component or more. In some embodiments, the solid component may be capable of providing a passivated surface area of about 200 square meters per gram or more, or in another example, about 250 to about 350 square meters per gram or more. These high surface area solid components react with the lubricant compounds available in the package cavity 42 to regulate the lubricant vapor pressure available in the package headspace, as will be described in greater detail below.

Suitable examples of inorganic solid components with high surface areas include metal oxides, such as aluminas, including hydrated or "transition" aluminas, which are manufactured specifically to provide these high surface areas. In one preferred embodiment, a high surface area material is grade CP-5 alumina, manufactured by Engelhard Corporation, Vidalia, La. In another preferred embodiment, a high surface area material is DD-290 alumina, also manufactured by Engelhard Corporation, which material can provide a surface area of, for example, about 270 m$^2$/g. Further suitable materials can include semiconductor oxides, including silicas, such as hydrated silicas, silica gels, and high surface area silicas, such as fumed silica and powdered silica (eg. nanoparticle silica). In certain embodiments, the material may include aluminosilicate powders. Other high surface area material which can absorb or adsorb macroscopic quantities of the lubricant compounds can also be used. Examples of the inorganic solid components can include natural and synthetic zeolites, powdered and/or porous metal oxides, powdered metals and/or porous metals, metal foam, and ceramics. Non-limiting examples, of suitable metals include powdered and/or porous noble metals or noble metal foams. Examples of ceramics include shaped ceramics, formed ceramics, and fired ceramics, which are well known in the art.

Examples of compounds suitable as organic solid components include: polymers, including oxygenated polymers, such as polyvinyl butyral; polysaccharides such as cellulose, hydroxypropylcellulose, chitin, and their functional derivatives; polyamines such as polyvinyl pyridines, including poly (2-vinylpyridine), poly(4-vinylpyridine), copolymers of 2-vinylpyridine and 4-vinylpyridine; polyamides such as poly(vinylpyrrolidone); and polysulfones such as poly(p-phenylene sulfone). In certain embodiments, the solid components may be cross-linked polymers with a high surface area, such as cross-linked polyvinyl pyridines. These polymers react with the lubricant compounds available in the package cavity 42 to regulate the lubricant vapor pressure available in the package headspace.

The benefits of a high surface area solid component can include reduced mass, reduced volume, and lower cost of the final product. Materials having surface areas substantially lower than those discussed above are also comprehended by the present application. For example, a material, such as an alumina, silica or aluminosilicate, with a surface area greater than or equal to about 0.1 m$^2$/g can be of use in the present application, as long as a sufficient quantity is used to realize the desired adsorbent surface area/device surface area ratio, which ratio will be discussed in greater detail below.

The solid component of reservoir 40 acts as a sink for the lubricant by providing a large surface for reversibly binding the lubricant. The reversibly bound lubricant compounds can later be released intact from the solid component. Through constant sorption to and desorption from the solid component, an equilibrium lubricant vapor pressure is established and maintained in the package cavity 42. Generally speaking, an equilibrium vapor pressure is established when the rates of sorption and desorption of the lubricant from the reservoir are approximately the same.

Therefore, the lubricant vapor pressure in cavity 42 can be sufficiently high so that lubricant vapor reacts with the surfaces of the MEMS device, such as DMD die 34, to replenish the oriented passivation layer as it is worn away by contact between components of the MEMS device. For example, the vapor pressure of lubricant in cavity 42 may range from about 0.1 microtorr to about 10 torr at room temperature.

In some embodiments, the binding energy of the lubricant compounds to the solid component may be approximately the same as the binding energy of the lubricant compounds to the surface of the MEMS device. This can be accomplished by choosing a material for the solid component that is similar to the material of the surface of the MEMS device to be passivated. For example, where the surface of the device to be passivated comprises aluminum, an aluminum alloy, aluminum oxide or an oxide of an aluminum alloy, then the solid component of the reservoir can comprise an alumina material, such as an alumina powder.

Aluminum surfaces often have native oxides formed thereon, and/or may have water or hydroxyl radicals bonded thereto. Where such aluminum surfaces are to be passivated, it may be desirable to employ a transition alumina, which may or may not be hydrated, as the solid component in the reservoir. While not wanting to be limited by theory, it is thought that transition alumina surfaces may resemble the surface of the aluminum of the MEMS device to be passivated, both surfaces being oxidized and/or hydrated aluminum, and may therefore provide a surface having a similar binding energy to that of the MEMS device.

In another embodiment, where the surface of the MEMS device to be passivated comprises silicon or silicon oxide, then a high surface area silica, such as fumed silica or nanoparticle silica may be chosen as the solid component. Suitable fumed and nanoparticle silicas are well known in the art. Similar to MEMS devices having aluminum surfaces, the silicon surface of the MEMS device to be passivated may have a native oxide formed thereon, and/or may have water or hydroxyl radicals bonded thereto.

The solid component can be present in the reservoir in any desired or effective amount so long as it allows for a surface area that is capable of providing a sufficient supply of the lubricant compounds to achieve the desired equilibrium vapor pressure in cavity 42 and thereby maintain the passivation layer on the MEMS device. In maintaining the equilibrium vapor pressure, the greater the surface area of the reservoir that is coated with lubricant, the more favorable desorption from the reservoir will be compared to desorption from the MEMS device. For this reason, reservoir 40 can have a greater surface area for adsorbing/desorbing lubricant than the MEMS device, as discussed above.

For embodiments in which the lubricant forms a surface absorbed molecule on the surfaces of the reservoir, each lubricant molecule will occupy between 20 square Angstroms and 50 square angstroms of solid component surface. Given the teachings of the present application, one of ordinary skill in the art would be capable of calculating a desired surface area of the reservoir given the number of molecules required to cover the surface area of the MEMS device to be passivated. In embodiments, an excess of lubricant may be employed due to loss of lubricant inherent in processing the MEMS devices, such as drying, baking, and the like.

Binders may optionally be employed in the reservoir composition. In embodiments where organic compounds are employed as solid complexing agent components, it may be possible for the organic solid components in the composition to also act as a binder for other components of the reservoir composition. For example, where both inorganic and organic solid components are used, the organic solid component can act as a binder for the inorganic solid component, as well as for other inorganic components, such as desiccants and oxygen absorbing materials, which will be discussed in more detail below. In other embodiments, binders other than the organic solid components discussed above may be employed, either in addition to or in place of the organic solid component.

Any suitable polymer binder can be used that shows good adhesion to inorganic substrates, as well as the ingredients of the reservoir composition, such as the lubricant and the solid component. Examples of suitable polymer binders include oxygenated polymers, such as poly(vinyl alcohol) derived polymers and copolymers, for example, poly(vinyl butyral) and poly(ethylene-co-vinyl acetate); and modified celluloses such as methyl cellulose, ethyl cellulose, hydroxypropyl cellulose, cellulose acetate, and cellulose triacetate. Other suitable binders include thermoplastic polymers, such as copolymers of ethylene and propylene; thermally cured epoxies; thermally cured urethanes; silicones; and the like; and mixtures thereof.

In certain embodiments, both an inorganic solid component complexing agent and a polymer binder solid component complexing agent may be employed. For example, an alumina, silica, or zeolite solid component and any of the polymer solid component complexing agents discussed above may be employed in the same composition.

In some embodiments, the reservoir compositions of the present application can comprise a water absorbing material, or desiccant. Any suitable desiccant known in the art may be employed. The desiccant can regulate the vapor pressure of water in package cavity 42. In some embodiments, the desiccant can have a surface binding energy that is less than a surface binding energy associated with the solid component, wherein the desiccant can reversibly react with water. Non-limiting examples of suitable desiccant material include silica; alumina; natural zeolite; synthetic zeolite; metal sulfates, which form hydrates such as calcium sulfate, magnesium sulfate, yttrium sulfate, and cobalt sulfate; tartrates, such as sodium tartrate; citrates, such as magnesium citrate, calcium citrate, sodium citrate; perchlorates, such as magnesium perchlorate; and clay minerals such as, smectite, montmorillonite, illite and kaolinite; and the like, and mixtures thereof.

In one embodiment, the desiccant may be a molecular sieve, such as a powdered hydrated aluminosilicate (zeolite) material. Water molecules enter the pores of the molecular sieve where they are adsorbed. Molecular sieve drying agents may provide benefits when used in certain embodiments because the water vapor pressure inside the package can be modulated by the molecular sieve material across a wide temperature range. For example, micromirror devices are often exposed to very intense light. The light can elevate the temperature of the micromirror device to well above 60° C. Molecular sieves are capable of retaining the adsorbed water vapor at higher temperatures than many other drying agents, which tend to release the captured water vapor at lower temperatures.

In another embodiment, the reservoir can also optionally comprise an oxygen absorbing material. Non-limiting examples include iron-based oxygen absorbers, such as iron powders, and polymeric oxygen absorbers, such as oxidizing polymers, and mixtures thereof.

The concentration of inorganic material, such as the inorganic dessicants, oxygen absorbing material and solid components discussed above, in the reservoir may be any suitable concentration which achieves the desired chemical effects in cavity 42. In one embodiment, where reservoir 40 comprises one or more polymers, the ratio of the combined weight of the one or more polymers to the weight of the inorganic material may range, for example, from about 1:2 to about 1:100. According to another embodiment, the polymer to inorganic material weight ratio may range from about 1:4 to about 1:15.

Figure 5:
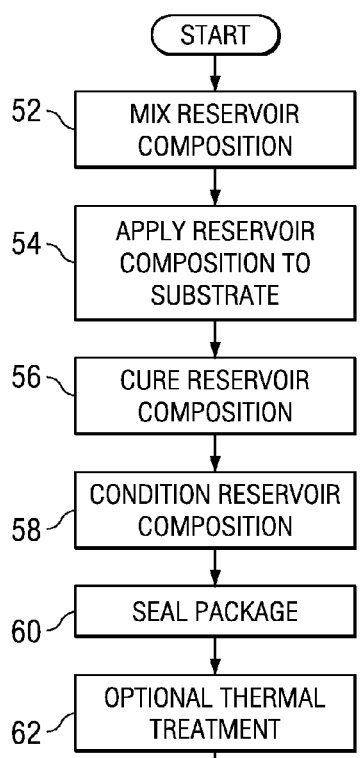
FIG. 5 is a flowchart diagram of a process for forming a reservoir comprising a lubricant, according to an embodiment of the present application.

FIG. 5 is a flowchart showing a method of making a reservoir for use with a micro-electromechanical device having a first surface area to be lubricated, according to one embodiment of the present application. The method involves forming a mixture by combining a solid component forming material and at least one ingredient chosen from a lubricant, a binder forming material, a desiccant and a solvent, as indicated in block 52. The solid component forming material can be any of the materials described herein for forming a solid component of a reservoir. Similarly, the lubricant, binder forming material, desiccant and solvent can be any of those described herein for use in forming the reservoirs of the present application. After mixing, the reservoir composition can be applied onto a desired portion of a MEMS device package, such as cover 36, as described above in connection with the embodiments of FIGS. 3 and 4.

It is generally desirable to formulate the composition indicated in block 52 with an excess of lubricant, such that at the end of the process described below there remains a suitable level of lubricant in the package cavity after the package is sealed in block 60. For example, in one embodiment 2 to 20 times the amount of lubricant required to fully complex the solid component can be mixed into the composition during the process of block 52. In another embodiment, 3 to 5 times the amount of lubricant required to fully complex the solid component can be mixed into the composition.

The reservoir composition of block 52 can optionally comprise any suitable carrier solvent that is volatile enough to cure in a reasonable amount of time, such as, for example, less than one day. Suitable solvents may be capable of dissolving one or more of the ingredients of the reservoir composition, such as the binder, and/or allowing formulation of the ingredients into a mixture. Non-limiting examples of suitable solvents include water, hydrocarbons, alcohols, ethers, esters, and carboxylic acids.

It generally is desirable that the solvents be chosen so that they evaporate without leaving harmful residue, although it is understood that some traces of solvent may remain after the curing process. The curing process, discussed further below, may occur at any suitable conditions appropriate for removing the solvent, such as curing at room or elevated temperature, with or without a vacuum, to assist in removing the solvent.

Any suitable solvent concentrations and/or mixing conditions may be employed that will provide the desired consistency of the reservoir composition for forming the reservoir. Example solvent concentrations may range from about 2:1 to about 1:100 solid to solvent weight ratio, such as a solid to solvent weight ratio ranging from about 1:1 to about 1:10. Mixing may occur, for example, at room or elevated temperature, with or without a vacuum, or under controlled humidity conditions to achieve a suitable consistency for application to the substrate. In certain embodiments, the reservoir composition may be in the form of a paste.

Figure 4:
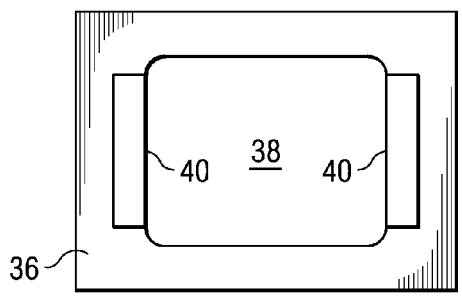
FIG. 4 is an underside view of the cover comprising the reservoirs taken along line 2-2 in FIG. 3, according to an embodiment of the present application.

After mixing is complete, the mixture of block 52 can be applied to a substrate, such as a desired portion of a MEMS device package, as shown in block 54. The reservoir composition may be extruded onto, for example, a package substrate, package cover or window, or a spacer ring. The reservoir composition may be applied in dots, strips, or any other shape or form that does not interfere with the operation of the device. For example, as illustrated in the embodiment of FIGS. 3 and 4 described above, reservoir composition of block 52 is applied to cover 36 in the form of strips to form reservoirs 40.

Referring to block 56 in the flow diagram of the FIG. 5 embodiment, the reservoir composition is then cured to form a reservoir having a solid component, as described herein. The cure process can be performed at an elevated temperature and/or in the presence of a vacuum in order to remove all or substantially all traces of solvent from the reservoir composition. If the reservoir composition comprises a polymer forming compound, partial or complete polymerization can occur. In embodiments where curing is performed at elevated temperatures, heating may occur in any suitable manner, including heating by conduction, convection and/or radiation. In one embodiment, the cure process can be performed under vacuum at room temperature.

In some embodiments, the curing process can be performed in multiple steps. For example, a first cure process can be performed at a first set of atmospheric conditions, such as a first temperature and a first pressure; followed by a second cure process at a second set of conditions, such as a second temperature and/or second pressure. The second cure process can occur at atmospheric conditions that are sufficient to at least partially remove one or more volatile components, such as solvents, unreacted materials and other undesirable components not removed during the first cure process. The first set of atmospheric conditions can be the same or different than the second set of atmospheric conditions. For example, in one embodiment a first cure process may be performed at a first temperature and pressure sufficient to cause a desired degree of polymerization of a polymer binder; followed by a second cure process at temperature and pressure conditions that are different than those used in the first cure process in order to remove additional solvents and other volatiles not removed during the first cure process.

After the cure process, the reservoir composition can optionally be conditioned, as shown in block 58, to set the initial moisture content of reservoir 40. The conditioning process can be carried out at an elevated temperature and/or under vacuum in, for example, a sealed system. For example, the conditioning process 58 may comprise heating the reservoir composition to a sufficient temperature in the presence of a vacuum to remove water from the reservoir 40 until a desired moisture content is achieved.

Once the conditioning process 58 is carried out, the package may be sealed, as indicated in block 60. Any suitable technique for sealing the package may be employed. Suitable techniques for sealing such packages are well known in the art.

In some embodiments, a thermal treatment can be carried out as a final step in the processing of the device, as shown in block 62 of the FIG. 5 embodiment. Suitable examples of such thermal treatments are described in U.S. Pat. No. 6,204,085, issued Mar. 20, 2001, to Strumpell et al., the description of which is herein incorporated by reference in its entirety. The thermal treatment can serve to alter and equilibrate the concentrations of chemical species within the package cavity 42. Chemical reactions inherent to the temperatures involved in this step may occur in the headspace and are comprehended by the present invention as a step in the establishment of the final headspace composition.

In some embodiments, the reservoir composition can be mixed with lubricant, as described above in connection with block 52. In other embodiments, the reservoir mixture that is applied to the MEMS device package in blocks 52 and 54 does not contain a lubricant. Instead, the lubricant can be introduced into reservoir 40 during the conditioning process of block 58, by exposing reservoir 40 to the lubricant in the form of a gas. The gaseous lubricant is absorbed by the reservoir composition to pre-load reservoir 40. Once reservoir 40 is pre-loaded with lubricant, the package is sealed as indicated by block 60.

In yet another embodiment, lubricant in a solid form may be deposited in the package cavity 42, and the package sealed as indicated in block 60. After the sealing process, the package is heated, causing the solid lubricant to vaporize and the resulting gaseous lubricant compounds to be absorbed by reservoir 40.

Techniques for pre-loading, or impregnating, reservoirs of MEMS device packages with lubricant are well known in the art. One such exemplary technique is described in U.S. Pat. No. 5,939,785, the description of which is hereby incorporated by reference in its entirety.

The lubricant can be present in reservoir 40 in any desired or effective amount. For example, it can be present in an amount sufficient to provide or maintain a monolayer coating on surface 4, as illustrated in FIG. 1, which is capable of achieving the desired lubrication and passivation benefits, as described above. In some embodiments, the final amount of lubricant present in the package is sufficient to complex all sites in the reservoir and on the device which are capable of binding said lubricant while maintaining a desired vapor pressure of the lubricant in the device package. In certain embodiments, an excess of the lubricant may result in undesirable condensation of liquid or solid lubricant on package or device surfaces.

In some embodiments, it is desirable that the curing and conditioning processes described above remove the vast majority of the carrier solvent and water from the desiccant, while leaving behind a suitable amount of lubricant complexed with the solid component. This can be accomplished by choosing a solvent with a lower boiling point than the lubricant. For example, by choosing hexanol as solvent and octanoic acid as the lubricant, the curing steps may achieve the desired result if the temperatures during the curing and conditioning steps are kept below the boiling point of octanoic acid, such as 150° C. or lower, such as below 125° C.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," include plural referents unless expressly and unequivocally limited to one referent. Thus, for example, reference to "an acid" includes two or more different acids. As used herein, the term "include" and its grammatical variants are intended to be non-limiting, such that recitation of items in a list is not to the exclusion of other like items that can be substituted or added to the listed items.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

Example

A mixture of 0.5 g of poly(vinyl butryal), 3.0 g of n-hexanol, 0.8 g octanoic acid, 3.0 g Engelhard CP-5 alumina, and 1.0 g powdered 3 A molecular sieve was prepared in a dispensing syringe and allowed to turn at room temperature for 48 hours. This mixture formed a reservoir paste composition that was dispensed onto windows for a DMD device and allowed to cure overnight in an ambient environment. After curing, the paste was a solid mass on the surface of the windows. The windows were baked in a convection oven for 1 hour at a temperature of 100° C., removed to a dry box environment, and attached via seam welding to a DMD device mounted in a ceramic carrier. Finally, the DMD device was baked at a temperature of at least 135° C. for at least 12 hours. The DMD device was found to operate stably and reliably.

What is claimed is:

1. A method of making a reservoir for use with a micro electromechanical system (MEMS) device attached to a first portion of a MEMS device package and having a first surface area to be lubricated, the method comprising:
    forming a reservoir composition by combining a material for forming a solid component of the reservoir and at least one ingredient chosen from a lubricant, a binder forming material, a desiccant and a solvent to form a mixture;
    applying the reservoir composition to a second portion of the MEMS device package;
    curing the applied reservoir composition to form the reservoir with the solid component, the reservoir comprising a porous solid structure having a second surface area, wherein the second surface area is greater than the first surface area;
    applying the lubricant to the MEMS device, the solid component reversibly reacts with the lubricant; and
    sealing the package after applying the lubricant causing portions of the lubricant in the reservoir, on the first surface of the MEMS device, and in a vapor phase to reach a chemical equilibrium whereby the lubricant displaced from the first surface is replenished and a passivation layer is maintained on the MEMS device.

2. The method of claim 1, wherein the solid component is a powder.

3. The method of claim 2, wherein the powder is silica powder.

4. The method of claim 2, wherein the powder is alumina powder.

5. The method of claim 1, wherein the lubricant comprises a linear, branched or cyclic, aliphatic or aromatic organic compound having a proton acidic functional group with an acid dissociation constant of no more than approximately seven.

6. The method claim 5, wherein the proton acidic functional group comprises oxygen atoms bound to main group atoms, and at least one oxygen atom bound to a hydrogen atom.

7. The method of claim 1, where the lubricant is a saturated, linear aliphatic carboxylic acid with the general formula $C_nH_{2n+1}COOH$, where $1<=n<=30$.

8. The method of claim 1, wherein curing the mixture comprises subjecting the mixture to a first temperature and a first pressure sufficient to form the solid component having the porous solid structure and the second surface area.

9. The method of claim 1, further comprising subjecting the mixture to a second cure process at atmospheric conditions that are different from the first curing process.

10. The method of claim 1, wherein the lubricant is a Bronsted base.

11. The method of claim 1, wherein the lubricant is an aliphatic amine.

12. The method of claim 1, wherein the MEMS device package includes a substrate and a cover the MEMS device is attached to the substrate, and the reservoir composition is applied to the cover.

13. The method of claim 12, wherein the cover has a window, and the reservoir composition is applied to form the reservoir along an edge of the window.

14. The method of claim 13, wherein the MEMS device is a digital micromirror device (DMD) die, and the reservoir composition is applied in strips to form reservoirs respectively along opposing edges of the window.

15. The method of claim 1, wherein the reservoir composition is applied to by extrusion.

* * * * *